US007444271B2

(12) United States Patent
Craske et al.

(10) Patent No.: US 7,444,271 B2
(45) Date of Patent: Oct. 28, 2008

(54) SCORING MECHANISM FOR AUTOMATICALLY GENERATED TEST PROGRAMS

(75) Inventors: Simon John Craske, Cambridge (GB); Eric Jason Furbish, Austin, TX (US); Jonathan William Brawn, Austin, TX (US)

(73) Assignee: ARM Limited, Cambridge (GB)

( * ) Notice: Subject to any disclaimer, the term of this patent is extended or adjusted under 35 U.S.C. 154(b) by 720 days.

(21) Appl. No.: 11/002,991

(22) Filed: Dec. 3, 2004

(65) Prior Publication Data
US 2006/0123272 A1 Jun. 8, 2006

(51) Int. Cl.
G06F 17/50 (2006.01)
G06N 3/00 (2006.01)
G06F 11/36 (2006.01)
(52) U.S. Cl. .............. 703/2; 703/6; 706/13; 714/25
(58) Field of Classification Search ............. 703/14, 703/22, 2, 6; 714/38, 25; 706/13
See application file for complete search history.

(56) References Cited

U.S. PATENT DOCUMENTS

| 5,488,573 | A | | 1/1996 | Brown et al. | |
| 5,708,774 | A | * | 1/1998 | Boden | 714/38 |
| 5,754,760 | A | | 5/1998 | Warfield | 714/38 |
| 5,913,064 | A | | 6/1999 | Chen | |
| 6,058,385 | A | * | 5/2000 | Koza et al. | 706/13 |
| 6,810,372 | B1 | * | 10/2004 | Unnikrishnan et al. | 703/13 |
| 6,885,983 | B1 | * | 4/2005 | Ho et al. | 703/14 |
| 7,007,249 | B2 | * | 2/2006 | Ly et al. | 716/4 |
| 2004/0015791 | A1 | | 1/2004 | Smith et al. | |
| 2005/0137992 | A1 | | 6/2005 | Polak | |
| 2005/0166096 | A1 | * | 7/2005 | Yount et al. | 714/38 |
| 2006/0218512 | A1 | * | 9/2006 | Arslan et al. | 716/4 |

FOREIGN PATENT DOCUMENTS

GB 2 397 905 8/2004

OTHER PUBLICATIONS

P. Thevenod-Fosse, "An Experimental Study on Software Structural Testing: Deterministic Versus Random Input Generation" Fault Tolerant Computing Symposium, FTCS-21, Digest of papers, Jun. 1991, pp. 410-417.
M. Bose et al, "A Genetic Approach to Automatic Bias Generation for Biased Random Instruction Generation" Evolutionary Computation 2001, May 2001, pp. 442-448.
M. Bose et al, "Automatic Bias Generation Using Pipeline Instruction State Coverage for Biased Random Instruction Generation" On-Line Testing Workshop 2001, Jul. 2001, pp. 65-71.

* cited by examiner

Primary Examiner—Thai Phan
(74) Attorney, Agent, or Firm—Nixon & Vanderhye P.C.

(57) ABSTRACT

A test program for a data processing apparatus is produced using a genetic algorithm which mutates instances being ordered lists of program instructions within a population forming the test program. The populations are evaluated using a metric by which the population as a whole is scored for its stimulation of predetermined functional points within the data processing apparatus when a determination is being made as to whether or not a particular instance should be swapped in or out of the population.

17 Claims, 5 Drawing Sheets

SCORING MECHANISM FOR AUTOMATICALLY GENERATED TEST PROGRAMS

BACKGROUND OF THE INVENTION

1. Field of the Invention

This invention relates to the field of data processing systems. More particularly, this invention relates to the automatic generation of test programs used to test data processing systems.

2. Description of the Prior Art

It is known to produce long sequences of program instructions which can be executed by a data processing system to test that data processing system. The tests can take a wide variety of forms. In one form the design of a data processing system may be checked by simulating execution of a test program with both an instruction set simulator and an RTL model of the data processing system so as to confirm that the final resulting state after execution is the same indicating that the RTL model is correctly representing the desired data processing system. At another level, test programs may be run to verify gate level design, e.g. upon FPGA to verify a design, on prototype manufactured products to verify their design or their correct manufacture, etc. Test programs to stimulate a data processing system will be seen from the above to have wide applicability. The thorough and rapid testing of data processing systems is becoming increasingly important as data processing system designs increase in complexity and there is a need to speed their development.

In order to achieve a high quality test it is desirable that a test program should stimulate the data processing system concerned to adopt a wide variety of possible functional states from within all possible functional states so as to increase the probability of detecting malfunctions or errors in the data processing system. In order to achieve such broad ranging test program coverage it has previously been known to handwrite test programs; a programmer with an extensive knowledge of the data processing system under test can use this knowledge to select sequences of program instructions which will stimulate a broad range of the different circuit elements and operations of the data processing system such that errors therein may be uncovered. However, as data processing systems increase in complexity and less time is available for producing test programs it is difficult for such test programs to be manually created in this way. The manual creation is also highly skilled, labour intensive and accordingly expensive.

It is known to automatically generate test programs for CPU testing using genetic algorithms. However, these known methods are highly constrained due to their use of static code generation and they are not able to determine the quality or correctness of the test coverage of the functional states of the system since they concentrate on RTL code coverage as their metric for feedback in the automatic generation.

SUMMARY OF THE INVENTION

Viewed from one aspect the present invention provides a method of generating tests for a data processing apparatus, said tests comprising a population of program instructions formed of a plurality of instances of ordered lists of program instructions, said method comprising:

(i) simulating functional states of said data processing apparatus occurring during simulated execution of said population;

(ii) noting simulated occurrence of predetermined functional states of said data processing apparatus during said simulated execution of said population;

(iii) calculating respective functional state score values for said predetermined functional states in dependence upon occurrence of said predetermined functional states during simulated execution of said population;

(iv) forming a population score value dependent upon a combination of said respective functional state score values;

(v) mutating one or more of said instances to form one or more candidate instances;

(vi) replacing at least one of said instances of said population with one of said candidate instances to form a candidate population;

(vii) repeating steps (i), (ii), (iii) and (iv) in respect of said candidate population to form a candidate population score value;

(viii) comparing said candidate population score value with said population score value;

(ix) replacing said population with said candidate population if said candidate population score value indicates that simulated execution of said candidate population results in simulated occurrence of a higher number of said predetermined functional states; and (x) repeating steps (v), (vi), (vii), (viii) and (ix) until one or more predetermined termination conditions are met.

The present technique provides for automated test program generation with an evaluation being made of the coverage of functional states adopted during simulated execution of that test code. A feedback mechanism is used which scores the population as a whole when deciding upon whether mutations do or do not improve the coverage of the test program. This feedback mechanism scoring the population as a whole when instances (tests) within the population have been changed provides rapid and reliable convergence upon test programs with a desirable degree of test coverage.

It will be appreciated that whilst the functional state score values could take a wide variety of different forms, including, for example, a simple count of the number of times that functional state was adopted during the test, preferred embodiments of the invention generate functional state score values as non-linear functions of such a count. The use of non-linear functions enables better performing test programs to be more rapidly generated by, for example, selecting against the repeated stimulation of a functional point which has already been stimulated a sufficient number of times during the test program.

As well as being dependent upon the occurrence of the determined functional states, the population score value can also be contributed to by a metric dependent upon the length of the test such that shorter tests are selected for when possible.

The individual instances (tests) may also be scored for respective functional states and this information can be used to control which instances within the population are replaced during mutation.

The process of evolving the test program can be considered to be a repeating sequence of mutation, evaluation and tournament processes. These processes can be performed upon an extended population of instances beyond the number which is needed to form the parent population for further mutation such that the additional instances can be evaluated and their suitability for replacing an instance within the parent population can be determined.

Whilst the simulation step may be performed using a variety of different simulators, it is desirable to use an instruction set simulator to perform this simulation. Instruction set simulators provide an advantageously rapid simulation and yet are able to track sufficient detail concerning the functional state of the data processing apparatus to determine if a wide range of functional states have been adopted and to score those states.

An architectural definition of the data processing apparatus may be annotated to indicate functional states of the data processing apparatus and this annotated architectural definition can then be used to at least partially automatically generate the instruction set simulator, permitted mutation rules and instances to (tests) be evaluated.

The functional states targeted by the test program could take a wide variety of different forms and advantageously include compound functional states being either a predetermined temporal sequence of functional states or a concurrent combination of independent state variables.

The simulation of execution of the test program may be undertaken by a single simulator, or alternatively by a plurality of simulators, including an RTL simulation or an FPGA simulation. It may be that different simulators are able to provide access to different types of functional state variables, such as power consumption indicators, which would not be available within an instruction set simulator, and accordingly extend the usefulness of the test programs generated. It is also possible that differences may be identified within the behaviour of different simulators, this being strongly indicative of a problem within a design under test that is worthy of further investigation.

Viewed from another aspect the present invention provides apparatus for processing data operable to generate tests for a data processing apparatus, said tests comprising a population of program instructions formed of a plurality of instances of ordered lists of program instructions, said apparatus comprising logic operable to perform the steps of:

(i) simulating functional states of said data processing apparatus occurring during simulated execution of said population;

(ii) noting simulated occurrence of predetermined functional states of said data processing apparatus during said simulated execution of said population;

(iii) calculating respective functional state score values for said predetermined functional states in dependence upon occurrence of said predetermined functional states during simulated execution of said population;

(iv) forming a population score value dependent upon a combination of said respective functional state score values;

(v) mutating one or more of said instances to form one or more candidate instances;

(vi) replacing at least one of said instances of said population with one of said candidate instances to form a candidate population;

(vii) repeating steps (i), (ii), (iii) and (iv) in respect of said candidate population to form a candidate population score value;

(viii) comparing said candidate population score value with said population score value;

(ix) replacing said population with said candidate population if said candidate population score value indicates that simulated execution of said candidate population results in simulated occurrence of a higher number of said predetermined functional states; and (x) repeating steps (v), (vi), (vii), (viii) and (ix) until one or more predetermined termination conditions are met.

Viewed from a further aspect the present invention provides a computer program product bearing a computer program for controlling a computer to perform a method of generating tests for a data processing apparatus, said tests comprising a population of program instructions formed of a plurality of instances of ordered lists of program instructions, said method comprising:

(i) simulating functional states of said data processing apparatus occurring during simulated execution of said population;

(ii) noting simulated occurrence of predetermined functional states of said data processing apparatus during said simulated execution of said population;

(iii) calculating respective functional state score values for said predetermined functional states in dependence upon occurrence of said predetermined functional states during simulated execution of said population;

(iv) forming a population score value dependent upon a combination of said respective functional state score values;

(v) mutating one or more of said instances to form one or more candidate instances;

(vi) replacing at least one of said instances of said population with one of said candidate instances to form a candidate population;

(vii) repeating steps (i), (ii), (iii) and (iv) in respect of said candidate population to form a candidate population score value;

(viii) comparing said candidate population score value with said population score value;

(ix) replacing said population with said candidate population if said candidate population score value indicates that simulated execution of said candidate population results in simulated occurrence of a higher number of said predetermined functional states; and (x) repeating steps (v), (vi), (vii), (viii) and (ix) until one or more predetermined termination conditions are met.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
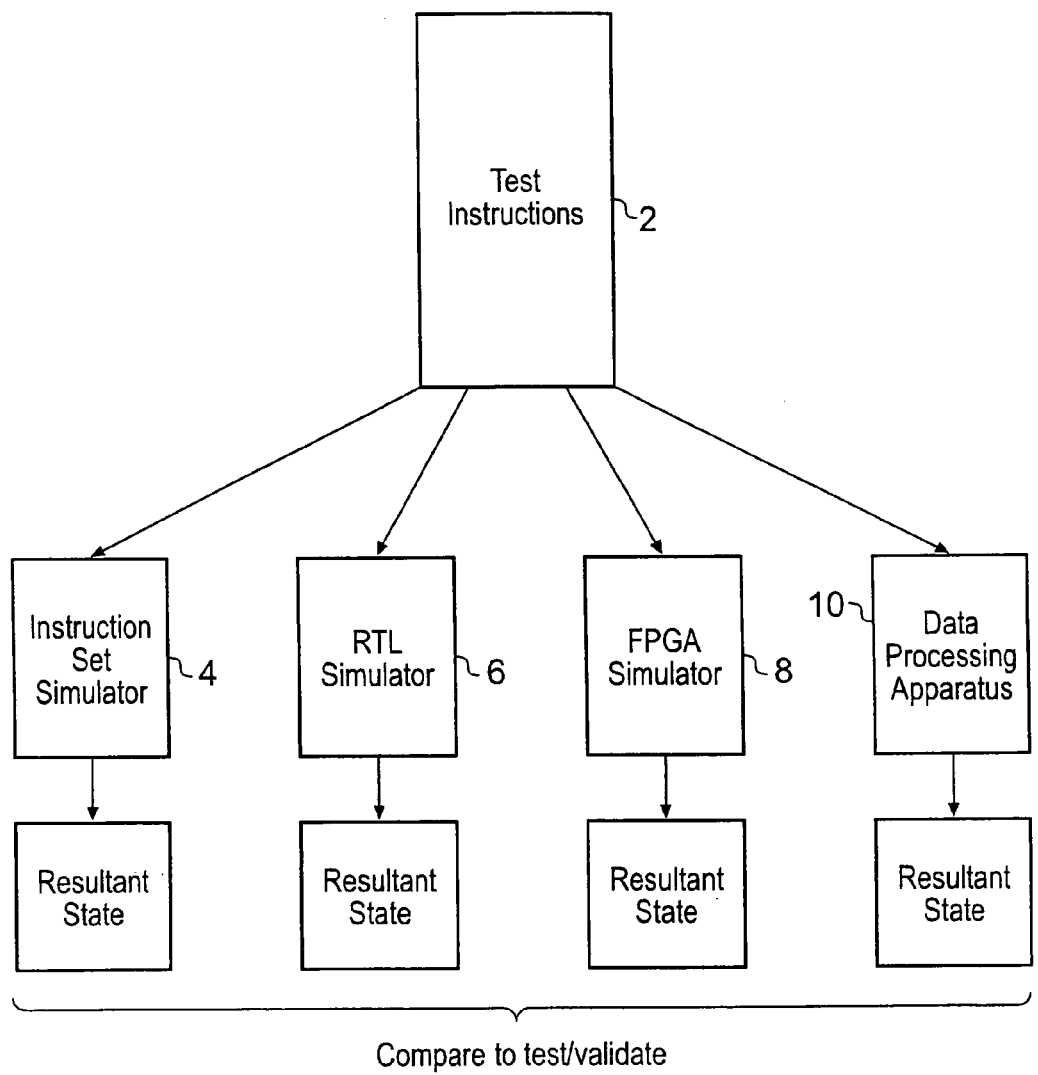
FIG. 1 schematically illustrates a test program being executed by various mechanisms and the resultant state information which can be compared to test and/or validate the design, manufacture, performance, etc of a data processing system.

FIG. 1 illustrates a test program 2 which can be considered as a population formed of a plurality of instances, each instance being an ordered list of program instructions forming a test. The test program 2 as a whole may then be simulated or executed by one or more of an instruction set simulator 4, an RTL simulator 6, an FPGA simulator 8 or a manufactured data processing apparatus 10. Each of these executions, whether simulated or real, produces resultant state data. This state data is compared with other state data produced by another form of execution of the test program so as to identify errors in the design or manufacture of the different mechanisms for execution the test program.

It will be appreciated that a test program executed on an instruction set simulator will produce a final resulting state. When the same test program is executed upon an RTL simulation of a proposed implementation of a data processing apparatus, then, if that RTL simulation is correct, then the result of executing the same test program on that RTL simulator should be the same as achieved with the instruction set simulator. If there is a difference, then this indicates that there is likely to be an error in the RTL level design of the data processing apparatus. Such an error can be corrected before that RTL design is manufactured. Similarly, a manufactured data processing apparatus executing the test program should produce the same final state as the instruction set simulator for that test program. A difference may indicate a design or manufacturing fault in the physical data processing apparatus 10.

In order to thoroughly test the various simulations and designs it is desirable that a broad range of the functional states which may be adopted by the data processing apparatus should occur during simulated or real execution of the test program. The present technique addresses the at least partially automatic generation of test programs which can achieve a broad range of functional state stimulation.

Figure 2:
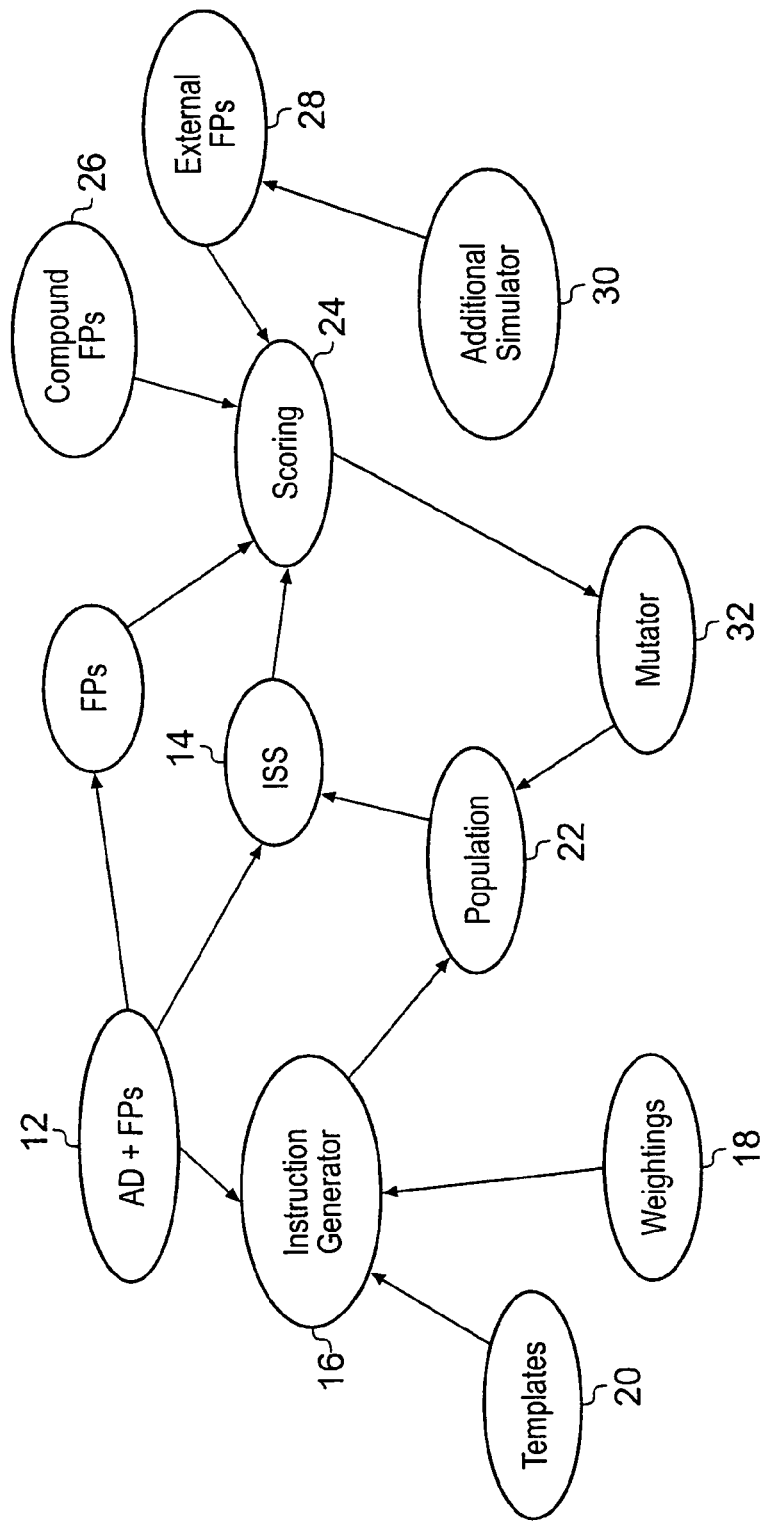
FIG. 2 schematically illustrates various elements and steps within the present technique for generating test programs.

FIG. 2 illustrates how an architectural definition AD of a data processing apparatus may be annotated with functional points FP so as to produce an annotated architectural definition 12. From this annotated architectural definition 12 an instruction set simulator 14, which is also annotated with the functional points data may be automatically generated. The functional points indicate the occurrence of fundamentally important developments during test simulation. These annotates are used by a genetic algorithm during mutation of the tests of evolve tests with desirable characteristics.

An instruction generator 16 also uses the annotated architectural definition 12 together with instruction weighting data 18 and instruction sequence templates 20 to generate candidate instances (tests) being ordered lists of program instructions which can be assembled to form a population 22 for mutation and evolution into the final test program. The weightings 18 can be used to favour inclusion of certain types of program instruction over others when it is known that these are more commonly utilised. The instruction templates can also be used to favour the inclusion of particular sequences of program instructions which are known to stress the design and accordingly are likely to help reveal problems.

The instruction set simulator 14 can simulate execution of the population 22 and score this using a scoring metric 24, as will be described later. The scoring metric notes the occurrence of predetermined functional states with these functional states being identified by functional point data supplied from the annotated architectural definition 12 and from manually created compound functional points 26 (these being temporal sequences of functional states or concurrent combinations of independent state variables selected by a user as good candidates for tests) as well as external functional points 28 which may be tracked by an additional simulator 30 which also executes the population 22. The scoring mechanism 24 feeds its scores into a mutating mechanism 32 which conducts a tournament between instances within the population 22 and candidate new instances to determine whether swaps should be made which may improve the test coverage performance of the test program. Such mutations can then be re-evaluated. The scoring mechanism 24 can also monitor termination conditions, such as the scores settling to at least locally optimal values, iteration number or time expiring or other suitable termination conditions.

Figure 3:
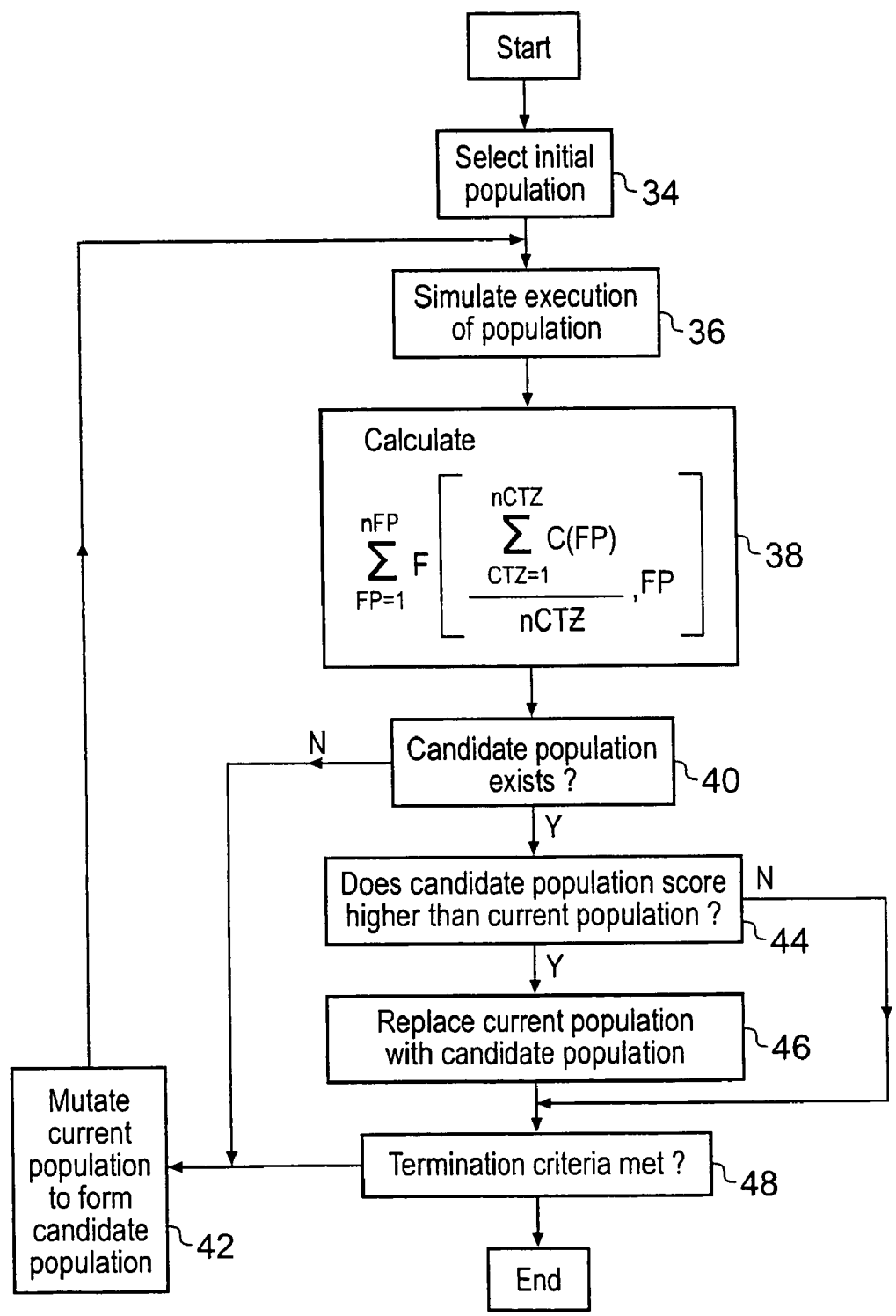
FIG. 3 is a flow diagram illustrating the scoring selection and mutation for forming test programs.

FIG. 3 is a flow diagram schematically illustrating the evaluation, tournament and mutation processes of the present technique. At step 34 an initial population comprising multiple instances each formed as an ordered list of program instructions is selected. The instruction generator 16 using the templates 20 and the weighting 18 is used to seed this population.

At step 36 simulated execution of the population is performed by the instruction set simulator 14 and any additional simulator 30. At step 38 the population score value for the entire population is calculated. The count value of a functional point produced by a given instance is averaged across the population of instances prior to a functional state score value being evaluated for that functional point. Those functional state score values are then summed to produce the population score value.

Step 40 then identifies whether the population scored at step 38 was a candidate population being compared against a previous population. If this is not the case, then processing proceeds to step 42 at which the population is mutated to form a new candidate population and processing returned to step 36.

If the scoring performed at step 38 was of a candidate population (e.g. this is currently the second or greater time the simulation has been performed), then processing proceeds to step 44 at which a determination is made as to whether or not the candidate population has a higher population score than the current population. If this is the case, then step 46 replaces the current population with the candidate population. Otherwise, step 46 is bypassed. Step 48 checks as to whether a termination criteria for the evolution of the test program has been reached, e.g. a solution has been converged upon, the time for evolution has expired etc. The mutation of the current population to form a new candidate population at step 42 will now be described in more detail.

As a starting point for the tournament, the population of candidates has been scored by the simulator, and their counters have been filled in with the score for the number of times each FP was hit during simulation. The incoming candidates are in order such that the first N candidates represent the previous parent population, and the subsequent candidates represent the new mutated tests.

The algorithm overview is:

Start by marking all of the first N candidates as being targeted for the new population using a 'TryMe' flag.

For this example, there are ten candidates, A-J, and a new generation of four citizens is wanted, so candidates A, B, C and D are marked as being the current best new generation.

A score card for each of the FPs is made, ranking the candidates by how well they score for that particular FP:

|     | Best | 2nd | 3rd | 4th | 5th | 6th | 7th | 8th | 9th | 10th |
|-----|------|-----|-----|-----|-----|-----|-----|-----|-----|------|
| FP0 | F    | A   | B   | G   | E   | J   | C   | H   | D   | I    |
| FP1 | A    | F   | G   | E   | B   | C   | H   | D   | J   | I    |
| FP2 | B    | G   | I   | F   | D   | A   | C   | H   | J   | E    |

The cut-off point is set at the number of citizens wanted in the new population:

|     | Best | 2nd | 3rd | 4th | 5th | 6th | 7th | 8th | 9th | 10th |
| --- | --- | --- | --- | --- | --- | --- | --- | --- | --- | --- |
| FP0 | F | A | B | G | E | J | C | H | D | I |
| FP1 | A | F | G | E | B | C | H | D | J | I |
| FP2 | B | G | I | F | D | A | C | H | J | E |

For each FP row in turn, ignore all citizens below the cutoff point, or that are already in the new population.

For FP0, A and B are already in the new population, so that leaves F and G.

|     | Best | 2nd | 3rd | 4th | 5th | 6th | 7th | 8th | 9th | 10th |
| --- | --- | --- | --- | --- | --- | --- | --- | --- | --- | --- |
| FP0 | F | A | B | G | E | J | C | H | D | I |

From the remaining citizens, pick the one with the highest score for this FP and try swapping it into the new population, in turn for each citizen below it in the row that appears in the current best new population, starting at the end of the list and working upwards.

So, for FP0, F is picked (the highest scoring candidate for FP0), and trial swapped with D, C, B and A in turn (that being the order, lowest to highest, that they score for FP0).

Re-score this newly created best population and see if it scores more highly than before the swap. If so, keep the change and stop processing this FP.

If it was found that swapping F and C yields a higher overall score then this substitution would be kept, the new best population would be A, B, D and F.

When all FP rows have been evaluated, stop.

Continuing the example, for FP1, A and F are already in the new population, so that leaves G and E.

G is picked, the highest scoring FP for FP1, and trial swapped in turn with D and B (A scores higher than G for FP1 and so is not a candidate for being swapped out). If it is found that swapping G and D yields a higher overall score then this substitution is kept.

The new best population would be A, B, F and G.

For FP2, B, G and F are already in the new population, so that leaves just I. I is trial swapped with A and then F (the members of the current best new population that have lower scores for this population, lowest first). If swapping I and A yields a higher overall score then this substitution is kept.

The final best new population is B, F, G and I.

Figures 4A, 4B:
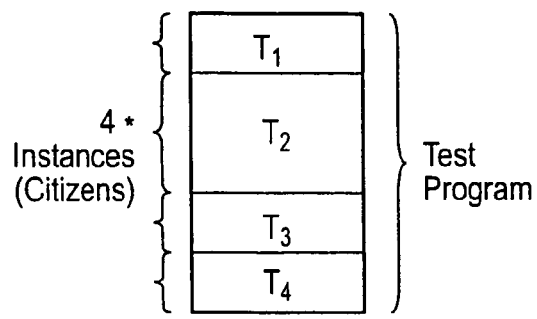
FIG. 4 schematically illustrates an example of the scoring metric used by the present technique.

FIG. 4 schematically illustrates the significance of scoring the population as a whole when determining whether an instance within that population should or should not be replaced. The scoring function applied to the count value as illustrated in FIG. 4 is non-linear, e.g. the score is 1 if the count is not 0 and the score is 0 if the count is 0. Many other non-linear scoring functions: may also be used, e.g. $a.\log(b+cn)$, $-0.05n^2+50n$, ... etc. As illustrated in FIG. 4, the population comprises four instances being ordered lists of program instructions (an instance is a test within a population of tests). The count values for the occurrence of particular functional states (points) during the simulation of the population (test program) are shown in an array form. It is desirable that each functional point should occur at least once, but there is no additional benefit for it occurring more than once. In part (a) of FIG. 4, the array for the instances $T_1$, $T_2$, $T_3$ and $T_4$ are shown. When each instance is evaluated on its own, the instance scores shown at the bottom of the array and totalling 9 are produced. This is not the technique which is desired. Instead, the functional point scores are evaluated across the population as a whole as indicated by the horizontally derived scores. In this example, each functional point is stimulated once during the test illustrated in part (a). It is of note that the only instance which stimulates $FP_4$ is $T_2$. However, this instance in itself has a low score since it does not stimulate any of the other functional points.

The mutator must determine whether or not to replace instance $T_2$ with a new candidate instance $T_5$. This instance scores highly as an instance in itself since it stimulates three of the functional points, but it does not stimulate $FP_4$.

Part (b) of FIG. 4 illustrates the scoring when $T_2$ is replaced by $T_5$. In this case, if the individual instances are scored in themselves and then these scores summed, the overall population of score would increase. However, it will be appreciated that the actual population is worse in achieving overall coverage of the functional points since the only instance which stimulated $FP_4$ has been removed. However, the scheme by which the population as a whole is scored in respect of each functional point and then those population functional point scores summed produces the correct result indicating that the population score would be reduced by such a swap and accordingly such a swap should not be made.

Figure 5:
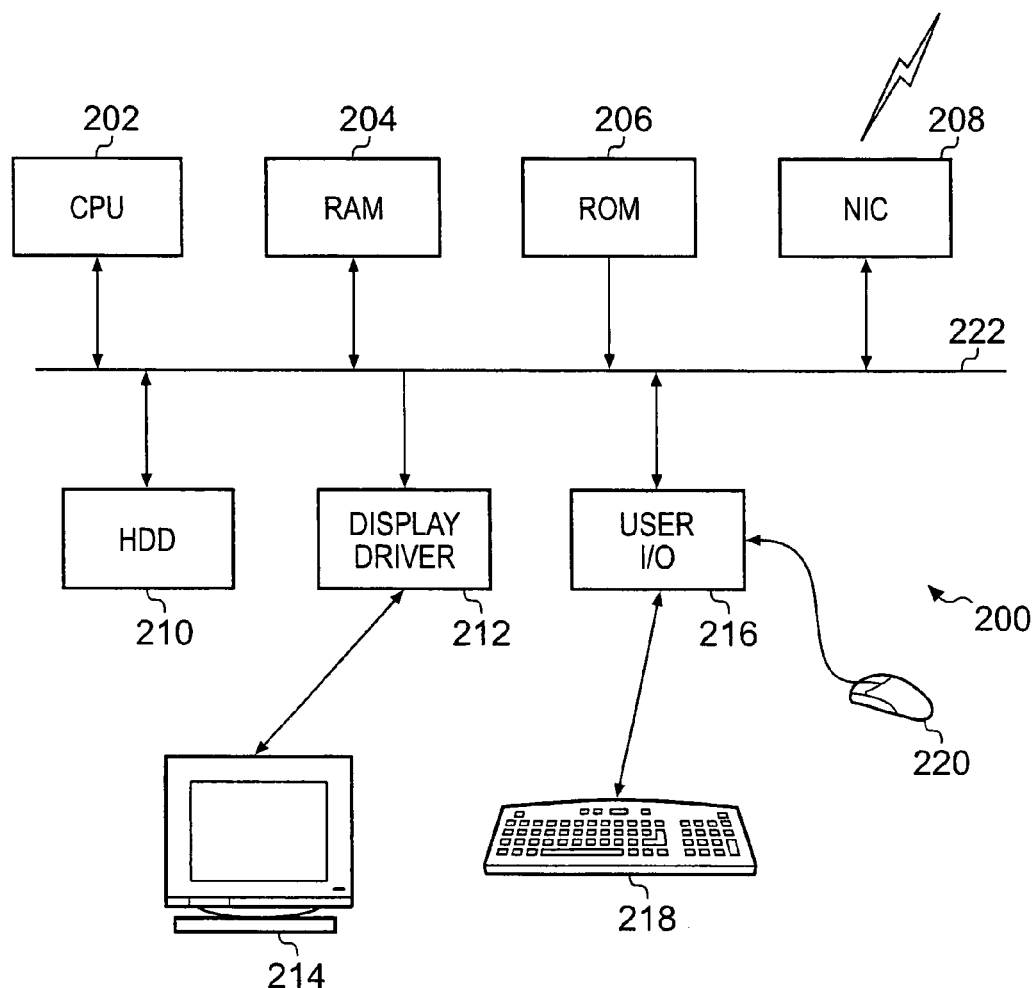
FIG. 5 schematically illustrates a general purpose computer which may be used to implement the above techniques.

FIG. 5 schematically illustrates a general purpose computer 200 of the type that may be used to implement the above described techniques. The general purpose computer 200 includes a central processing unit 202, a random access memory 204, a read only memory 206, a network interface card 208, a hard disk drive 210, a display driver 212 and monitor 214 and a user input/output circuit 216 with a keyboard 218 and mouse 220 all connected via a common bus 222. In operation the central processing unit 202 will execute computer program instructions that may be stored in one or more of the random access memory 204, the read only memory 206 and the hard disk drive 210 or dynamically downloaded via the network interface card 208. The results of the processing performed may be displayed to a user via the display driver 212 and the monitor 214. User inputs for controlling the operation of the general purpose computer 200 may be received via the user input output circuit 216 from the keyboard 218 or the mouse 220. It will be appreciated that the computer program could be written in a variety of different computer languages. The computer program may be stored and distributed on a recording medium or dynamically downloaded to the general purpose computer 200. When operating under control of an appropriate computer program, the general purpose computer 200 can perform the above described techniques and can be considered to form an apparatus for performing the above described technique. The architecture of the general purpose computer 200 could vary considerably and FIG. 5 is only one example.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A method of generating tests for a data processing apparatus, said tests comprising a population of program instructions formed of a plurality of instances of ordered lists of program instructions, said method comprising:

(i) simulating functional states of said data processing apparatus occurring during simulated execution of said population;

(ii) noting simulated occurrence of predetermined functional states of said data processing apparatus during said simulated execution of said population;
(iii) calculating respective functional state score values for said predetermined functional states in dependence upon occurrence of said predetermined functional states during simulated execution of said population;
(iv) forming a population score value dependent upon a combination of said respective functional state score values;
(v) mutating one or more of said instances to form one or more candidate instances;
(vi) replacing at least one of said instances of said population with one of said candidate instances to form a candidate population;
(vii) repeating steps (i), (ii), (iii) and (iv) in respect of said candidate population to form a candidate population score value;
(viii) comparing said candidate population score value with said population score value;
(ix) replacing said population with said candidate population if said candidate population score value indicates that simulated execution of said candidate population results in simulated occurrence of a higher number of said predetermined functional states; and
(x) repeating steps (v), (vi), (vii), (viii) and (ix) until one or more predetermined termination conditions are met.

2. A method as claimed in claim 1, wherein said functional state score values are non-linear functions of a count of simulated occurrences of respective predetermined functional states.

3. A method as claimed in claim 1, wherein said population score value is also dependent upon a total length of said ordered lists of program instructions forming said population, a candidate population having a shorter total length than said population resulting in a candidate population score value favouring said candidate population replacing said population.

4. A method as claimed in claim 1, wherein steps (ii) and (iii) determine respective functional states score values for each instance and step (vi) selects an instance within said population to be replaced in dependence upon one or more of said respective functional state score values for each instance.

5. A method as claimed in claim 4, wherein step (vi) selects said instance within said population to be replaced as that having a respective functional state score value corresponding to least occurrence of said predetermined functional state.

6. A method as claimed in claim 4, wherein said candidate population is selected by performing selections in turn for each of said respective functional state score values.

7. A method as claimed in claim 1, wherein steps (i), (ii) and (iii) are performed in respect of an extended population formed of a plurality of instances including those instances forming said population and said candidate population.

8. A method as claimed in claim 1, wherein step (i) is performed by an instruction set simulator.

9. A method as claimed in claim 8, wherein an architectural definition of said data processing apparatus defines at least functional operation of said data processing apparatus and is annotated to indicate functional states of said data processing apparatus, said instruction set simulator including indications of said predetermined functional states being at least partially automatically generated from said architectural definition.

10. A method as claimed in claim 9, wherein said mutation of step (v) is performed under control of permitted mutation rules at least partially automatically generated from said architectural definition.

11. A method as claimed in claim 9, wherein instances of ordered lists of program instructions are at least partially automatically generated from said architectural definition.

12. A method as claimed in claim 1, wherein said predetermined functional states include one or more compound function states being either a predetermined temporal sequence of functional states or a combination of independent state variables forming a functional state of said data processing apparatus.

13. A method as claimed in claim 1, wherein step (i) is performed using a plurality of independent simulators, at least one of said predetermined functional states being determined by only one of said independent simulators.

14. A method as claimed in claim 13, wherein one of said plurality of independent simulators is an RTL simulation of said data processing apparatus.

15. A method as claimed in claim 13, wherein one of said plurality of independent simulators is an FPGA simulation of said data processing apparatus.

16. Apparatus for processing data operable to generate tests for a data processing apparatus, said tests comprising a population of program instructions formed of a plurality of instances of ordered lists of program instructions, said apparatus comprising logic operable to perform the steps of:
(i) simulating functional states of said data processing apparatus occurring during simulated execution of said population;
(ii) noting simulated occurrence of predetermined functional states of said data processing apparatus during said simulated execution of said population;
(iii) calculating respective functional state score values for said predetermined functional states in dependence upon occurrence of said predetermine functional states during simulated execution of said population;
(iv) forming a population score value dependence upon a combination of said respective functional state score values;
(v) mutating one or more of said instances to form one or more candidate instances;
(vi) replacing at least one of said instances of said population with one of said candidate instances to form a candidate population;
(vii) repeating steps (i), (ii), (iii) and (iv) in respect of said candidate population to form a candidate population score value;
(viii) comparing said candidate population score value with said population score value;
(ix) replacing said population with said candidate population if said candidate population score value indicates that simulated execution of said candidate population results in simulated occurrence of a higher number of said predetermined functional states; and
(x) repeating steps (v), (vi), (vii), (iii) and (ix) until one or more predetermined termination conditions are met.

17. A computer program product comprising a computer readable storage medium containing computer readable instructions for controlling a computer to perform a method of generating tests for a data processing apparatus, said tests comprising a population of program instructions formed of a plurality of instances of ordered lists of program instructions, said method comprising:
(i) simulating functional states of said data processing apparatus occurring during simulated execution of said population;
(ii) noting simulated occurrence of predetermined functional states of said data processing apparatus during said simulated execution of said population;

(iii) calculating respective functional state score values for said predetermined functional states in dependence upon occurrence of said predetermined functional states during simulated execution of said population;

(iv) forming a population score value dependent upon a combination of said respective functional state score values;

(v) mutating one or more of said instances to form one or more candidate instances;

(vi) replacing at least one of said instances of said population with one of said candidate instances to form a candidate population;

(vii) repeating steps (i), (ii), (iii) and (iv) in respect of said candidate population to form a candidate population score value;

(viii) comparing said candidate population score value with said population score value;

(ix) replacing said population with said candidate population if said candidate population score value indicates that simulated execution of said candidate population results in simulated occurrence of a higher number of said predetermined functional states; and (x) repeating steps (v), (vi), (vii), (viii) and (ix) until one or more predetermined termination conditions are met.

* * * * *